US009494671B2

(12) United States Patent
Ngo (10) Patent No.: US 9,494,671 B2
(45) Date of Patent: Nov. 15, 2016

(54) METHOD AND APPARATUS FOR IMPROVING DIFFERENTIAL DIRECT (DC) MEASUREMENT ACCURACY

(71) Applicant: Advantest (Singapore) Pte. Ltd., Singapore (SG)

(72) Inventor: Thien Ngo, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 481 days.

(21) Appl. No.: 14/075,271

(22) Filed: Nov. 8, 2013

(65) Prior Publication Data

US 2015/0134287 A1 May 14, 2015

(51) Int. Cl.
| | |
|---|---|
| G01R 35/00 | (2006.01) |
| G01R 31/26 | (2014.01) |
| G01R 31/28 | (2006.01) |
| G01R 19/10 | (2006.01) |

(52) U.S. Cl.
CPC .............. *G01R 35/007* (2013.01); *G01R 19/10* (2013.01); *G01R 31/2601* (2013.01); *G01R 31/2834* (2013.01); *G01R 31/2851* (2013.01)

(58) Field of Classification Search
CPC G01R 35/007; G01R 19/00; G01R 31/2601; G01R 31/2834
USPC ...... 702/89, 91, 85, 107, 119, 106; 714/700, 714/724, 740, 738; 324/679, 750.02, 606, 324/99 R, 750.3
See application file for complete search history.

(56) References Cited

U.S. PATENT DOCUMENTS

| | | | | |
|---|---|---|---|---|
| 4,724,378 A * | 2/1988 | Murray | .............. | G01R 31/3191 324/74 |
| 6,414,496 B1 * | 7/2002 | McQuilkin | ........ | G01R 31/2839 324/606 |
| 7,206,710 B2 * | 4/2007 | Zhou | .................. | G01R 31/3191 324/601 |
| 7,290,189 B2 * | 10/2007 | Zhou | .................... | G01R 35/005 702/118 |
| 7,489,123 B2 * | 2/2009 | Cohen | ................ | G01R 31/3191 324/750.02 |
| 7,623,979 B2 * | 11/2009 | Visser | ................ | G01R 31/2822 702/85 |
| 7,823,128 B2 * | 10/2010 | Bundy | .................. | G06F 11/263 717/124 |
| 2004/0186675 A1 * | 9/2004 | Larson | ............... | G01R 31/3191 702/91 |
| 2006/0111861 A1 * | 5/2006 | Horne | .............. | G01R 31/31905 702/89 |
| 2006/0161368 A1 * | 7/2006 | Zhou | .................... | G01R 31/3191 702/106 |
| 2006/0176048 A1 * | 8/2006 | Zhou | .................. | G01R 31/3191 324/750.02 |
| 2006/0195749 A1 * | 8/2006 | Cohen | ................ | G01R 31/3191 714/742 |
| 2006/0236157 A1 * | 10/2006 | Huang | ............... | G01R 31/3191 714/700 |
| 2006/0236167 A1 * | 10/2006 | Zhou | .................... | G01R 35/005 714/724 |
| 2008/0024159 A1 * | 1/2008 | Tilbor | ................ | G01R 31/2841 324/99 R |
| 2010/0153792 A1 * | 6/2010 | Jang | ........................ | G11C 29/02 714/700 |
| 2014/0361798 A1 * | 12/2014 | Johnson | ............. | G01R 31/3191 324/750.02 |

* cited by examiner

*Primary Examiner* — Carol S Tsai (57) ABSTRACT

A method of error correction in automated test equipment (ATE) is presented. The method comprises calibrating the ATE using a calibration board, wherein the calibration board comprises a reference voltage. The calibrating comprises: (a) measuring the reference voltage using a reference channel and each of a plurality of channels in the ATE; (b) recording a series of differential voltage measurement values obtained from the measuring in a calibration module; and (c) calculating a respective correction factor for each of the plurality of channels utilizing the series of differential voltage measurement values. The method further comprises obtaining a measured voltage value for a DUT connected to a first channel in the ATE, wherein the first channel is one of the plurality of channels. Finally, the method comprises correcting the measured voltage value using a respective correction factor for said first channel.

18 Claims, 7 Drawing Sheets

METHOD AND APPARATUS FOR IMPROVING DIFFERENTIAL DIRECT (DC) MEASUREMENT ACCURACY

FIELD OF THE INVENTION

Embodiments of the present invention relate generally to automated device testing and more specifically to improving measurement accuracy for equipment used for automated device testing.

BACKGROUND OF THE INVENTION

Automated test equipment (ATE) can be any testing assembly that performs a test on a device, semiconductor wafer or die, etc. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor. Automatic Test Equipment (ATE) is commonly used within the field of electrical chip manufacturing. ATE systems both reduce the amount of time spent on testing devices to ensure that the device functions as designed and serve as a diagnostic tool to determine the presence of faulty components within a given device before it reaches the consumer.

In testing devices or products, e.g. after production, it is crucial to achieve among other factors a high product quality, an estimation of the device or product performance, a feedback concerning the manufacturing process and finally a high customer contentment. Usually a plurality of tests is performed in order to ensure the correct function of a device or product, commonly referred to as a device under test ("DUT") in testing parlance. The plurality of tests is typically part of a test plan that is loaded into the ATE system by the user. The test plan acts as a blueprint for running the tests on the DUTs. The plurality of tests may be compiled in a test flow wherein the test flow may be separated into different test groups which contain one or more tests for testing the device or product. For example, a semiconductor device may be tested with a test flow comprising contact tests, current-voltage tests, logic tests, speed tests, stress tests and functional tests.

One typical problem that commonly arises in ATE systems, especially ones that perform low current measurements, e.g., pico-amps, is the presence of thermal electromotive force (EMF). The presence of thermal EMF can adversely affect low resistance measurement accuracy. Every connection made with dissimilar metals creates an unwanted thermocouple in the measurement circuit. Each of these unwanted thermocouples generates an error voltage that varies with temperature gradients in the system. These can be on the order of many microvolts that can cause significant errors in low-ohm measurements. Accordingly, when performing low current measurements, thermal EMF can be a significant source of error and the user needs to be able to characterize this type of error to be able to effectively account for it when performing measurements. Calibration processes in conventional ATE systems do not have the capability of taking into account the differences in thermal EMF in all the different pairs of signal paths. As a result, thermal EMF is a significant limitation in improving measurement accuracy in conventional ATE systems.

BRIEF SUMMARY OF THE INVENTION

Accordingly, what is needed is an ATE system that accounts for differences in thermal EMF in the plurality of signal paths in the test system, thereby, facilitating accurate low current and voltage measurements. In one embodiment of the present invention, the calibration process can measure the respective thermal EMFs of each individual signal path using a statistical process. The calculated thermal EMFs of each path can be used to characterize each of the signal paths separately. The characterization can then be applied to the measurement values to yield more accurate measurement results. In one embodiment, the present invention provides a method and apparatus for measuring and removing thermal EMFs in each signal path of a high accuracy DC voltage measurement application.

In one embodiment of the present invention, a calibration mechanism is first employed to characterize the test apparatus prior to performing any measurements. As part of characterization, the calibration mechanism will employ a statistical process to characterize thermal EMF values for each individual signal path in the test apparatus separately. After performing DC voltage measurements, the characterized thermal EMF values can then be used to offset the measured values to determine a more accurate measurement result.

In one embodiment, a method of error correction in automated test equipment (ATE) is disclosed. The method comprises calibrating the ATE using a calibration board, wherein the calibration board comprises a reference voltage. The calibrating comprises: (a) measuring the reference voltage using a reference channel and each of a plurality of channels in the ATE; (b) recording a series of differential voltage measurement values obtained from the measuring in a calibration module; and (c) calculating a respective correction factor for each of the plurality of channels utilizing the series of differential voltage measurement values. The method further comprises obtaining a measured voltage value for a DUT connected to a first channel in the ATE, wherein the first channel is one of the plurality of channels. Finally, the method comprises correcting the measured voltage value using a respective correction factor for said first channel.

In another embodiment, a computer-readable storage medium having stored thereon, computer executable instructions that, if executed by a computer system cause the computer system to perform a method of error correction in automated test equipment (ATE) is disclosed. The method comprises calibrating the ATE using a calibration board, wherein the calibration board comprises a reference voltage and wherein the calibrating comprises: (a) measuring the reference voltage using a reference channel and each of a plurality of channels in the ATE; (b) recording a series of differential voltage measurement values obtained from the measuring; and (c) calculating a respective correction factor for each of the plurality of channels utilizing the series of differential voltage measurement values; and (d) storing a plurality of correction factors corresponding to the plurality of channels in a memory module.

In a different embodiment, a system for performing error correction in automated test equipment (ATE) is disclosed. The system comprises a memory comprising a test application stored therein; a test interface to connect to a plurality of DUTs; and a calibration board for calibrating the ATE, wherein the calibration board comprises a reference voltage, and wherein the calibration board is configured to plug into the test interface. The system further comprises a processor coupled to the memory and the test interface, wherein the processor is configured to: (a) measure the reference voltage using a reference channel and each of a plurality of channels in the ATE; (b) record a series of differential voltage measurement values obtained from the measuring in a calibration memory module; (c) calculate a respective correction factor for each of the plurality of channels utilizing the series of differential voltage measurement values; and (d) store a plurality of correction factors corresponding to the plurality of channels in a memory module.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "calibrating," "obtaining," "measuring," "recording," "determining," "correcting," and "calculating" (e.g., flowchart 700 of FIG. 7) of a computer system or similar electronic computing device or processor (e.g., system 110 of FIG. 1). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Figure 1:
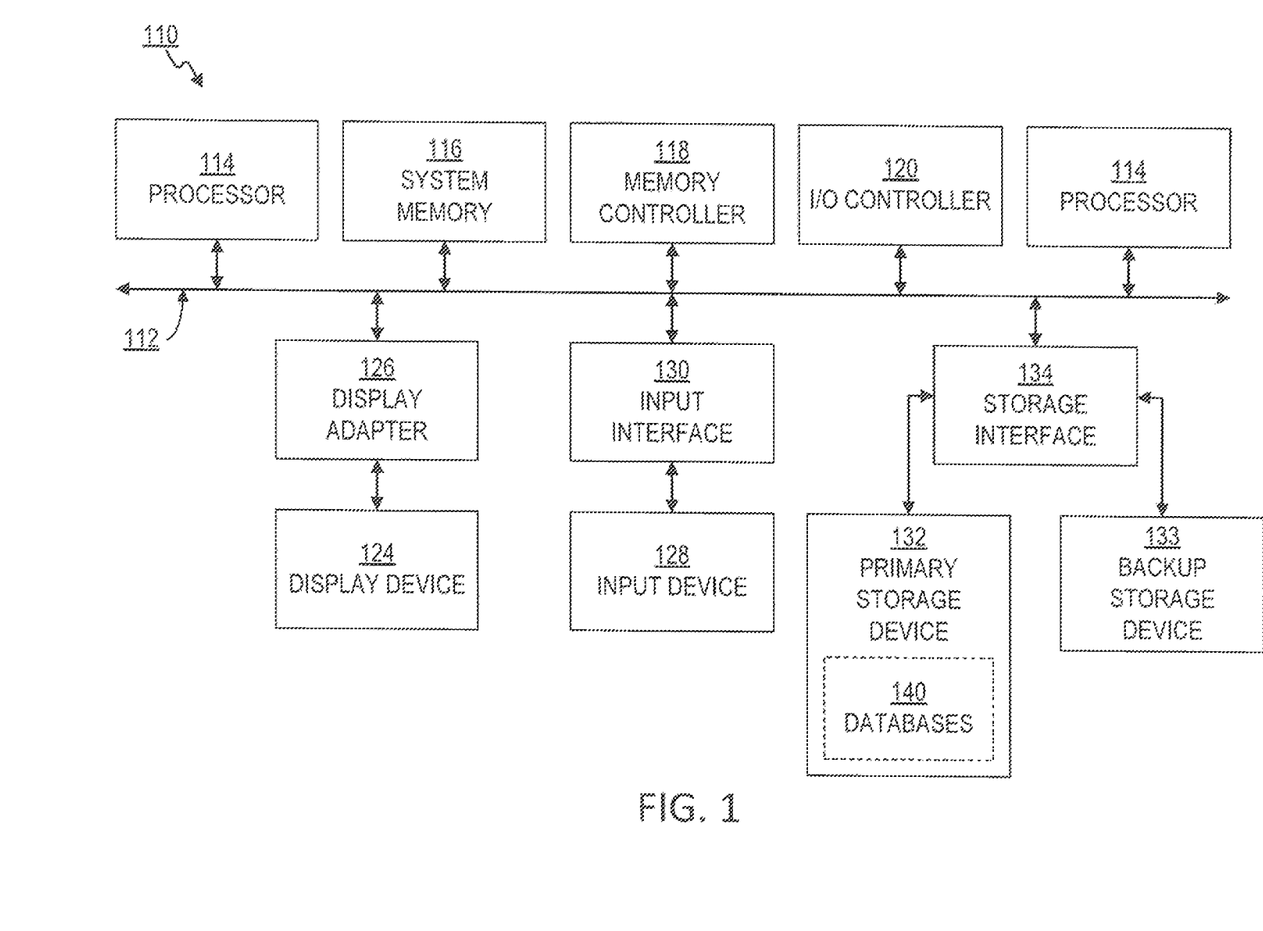
FIG. 1 is a computer system on which embodiments of the System on a Chip (SOC) automated test system (ATE) of the present invention used for testing devices under test (DUTs) can be implemented in accordance with one embodiment of the present invention.

FIG. 1 is a computer system on which embodiments of the System on a Chip (SOC) automated test system (ATE) of the present invention used for testing devices under test (DUTs) can be implemented in accordance with one embodiment of the present invention. For example, computing system 110, in one embodiment, could implement the site controller of the tester system, wherein the site controller connects to and controls the ATE of the present invention used for testing memory DUTs. Computing system 110 broadly represents any single or multi-processor computing device or system capable of executing computer-readable instructions. Examples of computing system 110 include, without limitation, workstations, laptops, client-side terminals, servers, distributed computing systems, or any other computing system or device. In its most basic configuration, computing system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 1, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 1, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 1, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 1, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 1 need not be present to practice the embodiments described herein. The devices and subsystems referenced above may also be interconnected in different ways from that shown in FIG. 1. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

For example, a computer program for running test plans may be stored on the computer-readable medium and then stored in system memory 116 and/or various portions of storage devices 132 and 133. When executed by the processor 114, the computer program may cause the processor 114 to perform and/or be a means for performing the functions required for sharing resources between multiple test cores in a concurrent test environment.

A Method and Apparatus for Improving Differential Direct Current ("DC") Measurement Accuracy In one embodiment, the present invention provides a method and system that accounts for differences in unwanted thermal EMF in all the different pairs of test signal paths of an ATE system, thereby, facilitating accurate low current and voltage measurements. The problem with conventional System on a Chip (SOC) test systems that can perform low current and voltage measurement, e.g., on the order of pico-amps and micro-volts, is that while they may perform a default correction for distortions in measurement resulting from thermal EMF, they do not account for the fact that the thermal EMF of each signal path varies due to many factors and, therefore, a different correction needs to be applied to each signal path to obtain more accurate measurement results. Stated differently, the problem with conventional ATE apparatuses is that they used a static thermal EMF value to correct for EMF related error. However, each signal path is different and, as a result, each path has a different thermal EMF.

In one embodiment of the present invention, the calibration process can allow the respective thermal EMFs of each individual test signal path to be measured using a statistical process. The calculated thermal EMFs of each path can be used to characterize each of the signal paths separately. The characterization can then be applied to the measurement values to yield more accurate measurement results. In one embodiment, the present invention provides a method and apparatus for measuring and removing thermal EMFs in each signal path of a high accuracy DC voltage measurement application.

In one embodiment, the invention provides a method and apparatus to measure and remove thermal EMF in the connection paths of a test apparatus being used in a high accuracy differential DC voltage measurement application. In this embodiment, the present invention can improve differential DC voltage measurement to the limit of the measurement instrument instead of being limited by the thermal EMF of the connection paths.

In one embodiment of the present invention, a calibration mechanism is first employed to characterize the test apparatus prior to performing any measurements. As part of characterization, the calibration mechanism will employ a statistical process to characterize thermal EMF values for each individual signal path in the test apparatus separately. After performing DC voltage measurements, the characterized thermal EMF values can then be used to offset the measured values to determine a more accurate measurement result.

Figure 2:
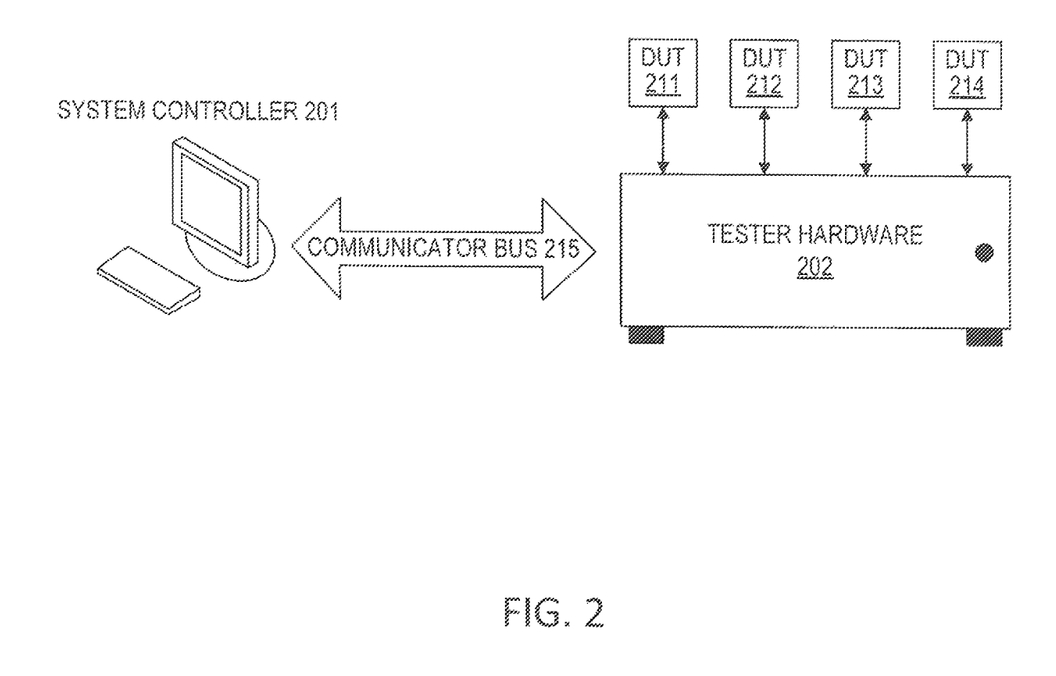
FIG. 2 is a schematic block diagram for an automated test equipment (ATE) apparatus for testing DUTs on which embodiments of the present invention can be implemented in accordance with one embodiment of the present invention.

FIG. 2 is a schematic block diagram for an automated test equipment (ATE) apparatus for testing DUTs on which embodiments of the present invention can be implemented in accordance with one embodiment of the present invention. In one embodiment, the system controller 201 comprises one or more linked computers. In other embodiments, the system controller often comprises only a single computer. The system controller 201 is the overall system control unit, and runs the software for the ATE that is responsible for accomplishing all the user-level testing tasks, including running the user's main test plan.

The communicator bus 215 provides a high-speed electronic communication channel between the system controller and the tester hardware. The communicator bus can also be referred to as a backplane, a module connection enabler, or system bus. Physically, communicator bus 215 is a fast, high-bandwidth duplex connection bus that can be electrical, optical, etc. In one embodiment, communicator bus 215 can use the TCP/IP protocol. System controller 201 sets up the conditions for testing the DUTs 211-214 by programming the tester hardware through commands sent over the communicator bus 215.

Tester hardware 202 comprises the complex set of electronic and electrical parts and connectors necessary to provide the test stimulus to the devices under test (DUTs) 211-214 and measure the response of the DUTs to the stimulus, and compare it against the expected response. In one embodiment, tester hardware 202 can comprise multiple site controllers, wherein each site controller is connected to multiple DUTs. Each site controller is a computer used in a device test and, in one embodiment, can perform substantially the same function as computing system 110. A test plan program can be executed on a site controller. The site controllers are connected to the system controller and test operations performed by a user are processed on the system controller, which controls the site controllers over communicator bus 215.

Figure 3:
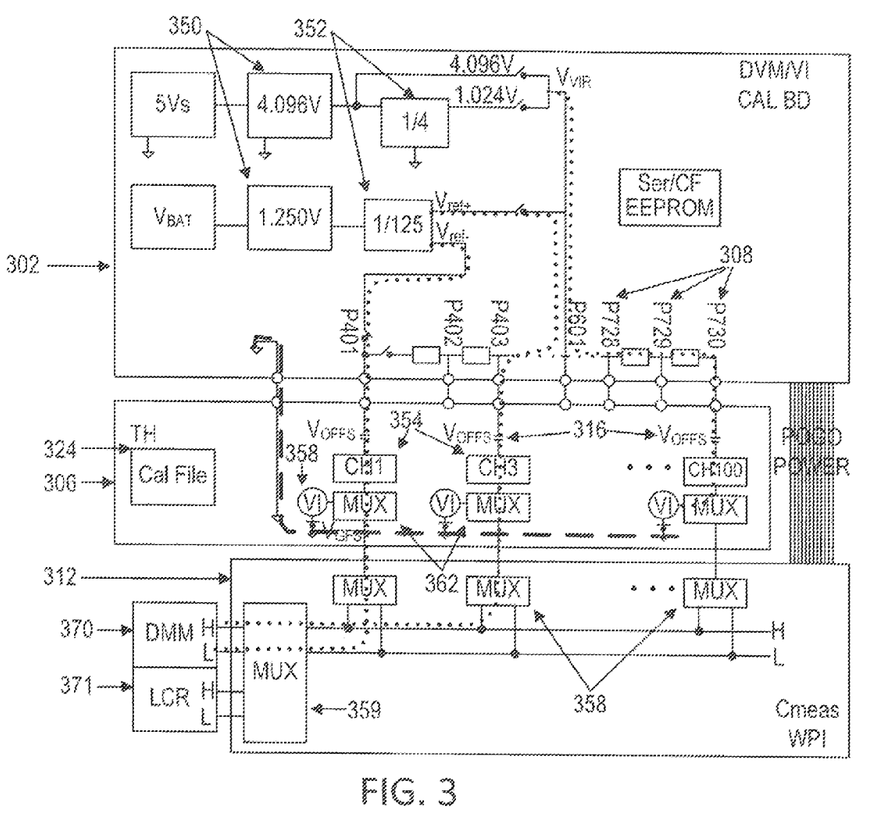
FIG. 3 is a block diagram illustrating the manner in which the test apparatus is calibrated in accordance with one embodiment of the present invention.

FIG. 3 is a block diagram illustrating the manner in which the test apparatus is calibrated in accordance with one embodiment of the present invention. The test apparatus needs to be calibrated before performing measurements in order to ensure the accuracy of the measurements. Measurement accuracy is especially important in test apparatuses capable of performing low current, e.g., on the order of pico-amps and low voltage e.g., on the order of micro-volts. Some of the factors that contribute to measurement errors are repeatable and predictable over time and temperature and can be removed. The calibration process characterizes the various predictable errors in the system that can then be mathematically removed during the measurement process.

Further, calibration is needed because the precision of the measurements taken by the test apparatus may need to be on the order of micro-volts, however, the accumulated error added as a result of the signal paths, test instrumentation and measurement instrumentation may be on the order of millivolts. Accordingly, the test apparatus needs to be calibrated to account for the various errors.

Calibration is typically performed each time the test apparatus is used to perform a new measurement by a user. As discussed above, the purpose of calibration is to characterize the path error, including thermal EMF related error, for each signal path precisely. In one embodiment, the signal path error can be characterized to a micro-volt level. Calibration is performed by first plugging a calibration board 302 into the test apparatus. The calibration board, in one embodiment, is plugged into the same interface that the DUTs will subsequently be plugged into for device testing.

An interface board 312 (also known as a Wafer Probe Interface board), in one embodiment, is used to route all the internal signals in the test head 306 of the test apparatus to pins on an external interface so that the calibration board or connected DUT can easily interface with the test system. The test head 306, in one embodiment, comprises a majority of the tester functionality and tester instruments. The interface board 312 allows the user to interface with the tester functionality and tester instruments within test head 306. In one embodiment, once calibration is performed, the user can plug the DUTs to be tested into the test apparatus, wherein the interface board 312 is used to provide an interface between the DUTs and the tester functionality within test head 306.

In one embodiment, the calibration board provides a DC voltage reference that can be used for calibration purposes. For example, calibration board 302 in FIG. 3 uses voltage references 350, a 4.096 Volt and a 1.25 Volt reference. In different embodiments, different voltage references can be used to accommodate the range of measurements in the test head 306. In the embodiment shown in FIG. 3, a high voltage reference, 4.096V, and a low voltage reference, 1.25V, is used. In certain embodiments, divider modules 352 may also be used so that different branches of measurement can be serviced. For example, a 1/125 divider module can be used to derive a 10 mV (1.25V/125) voltage reference from the 1.25 V reference.

Each of the signal paths or channels 354 within test head 306 connect to the calibration board through a series of associated external pins 308, e.g. P730, P729, etc. Each signal path can typically have a trace between 0 to 6 meters long between the origin point of the signal within the test apparatus and the external signal pin that connects to the calibration board or the DUT. Further, each trace may comprise multiple metal connections en route to the external interface signal pin. This results in thermal EMF and an undesirable voltage change along the signal path represented in FIG. 3 as offset voltage (Voffset) 316.

Accordingly, the digital multimeter (DMM) 370 will measure a differential voltage between two channels, e.g., CH1 and CH3 in FIG. 3 that may be inaccurate as a result of the thermal EMF related offset voltages in each channel. For example, in some cases there may be up to 200 microvolts of voltage offset or error resulting from thermal EMF depending on the length of the signal trace and temperature conditions. This offset voltage varies for each signal path, as explained above, and must be accounted or calibrated for when conducting high accuracy differential DC voltage measurement. In certain test apparatuses, there may be hundreds of signal paths. Embodiments of the present invention allow for the varying thermal EMFs of each path to be accounted for individually. The thermal EMF value of a given path may then be used to offset a measurement reading taken for that path using a DMM to obtain a more precise measurement value. In certain embodiments, the measurement reading may also be corrected for the voltage error added from the measurement instrumentation, e.g., DMM 370.

In one embodiment of the present invention, the offset voltages calculated to compensate for thermal EMF or the measuring instrument may be memory stored in a calibration file 324 located within test-head 306. Other calibration files besides DC voltage measurement, e.g. capacitance measurement, inductance measurement may also be stored in the same calibration file as well.

Figure 4:
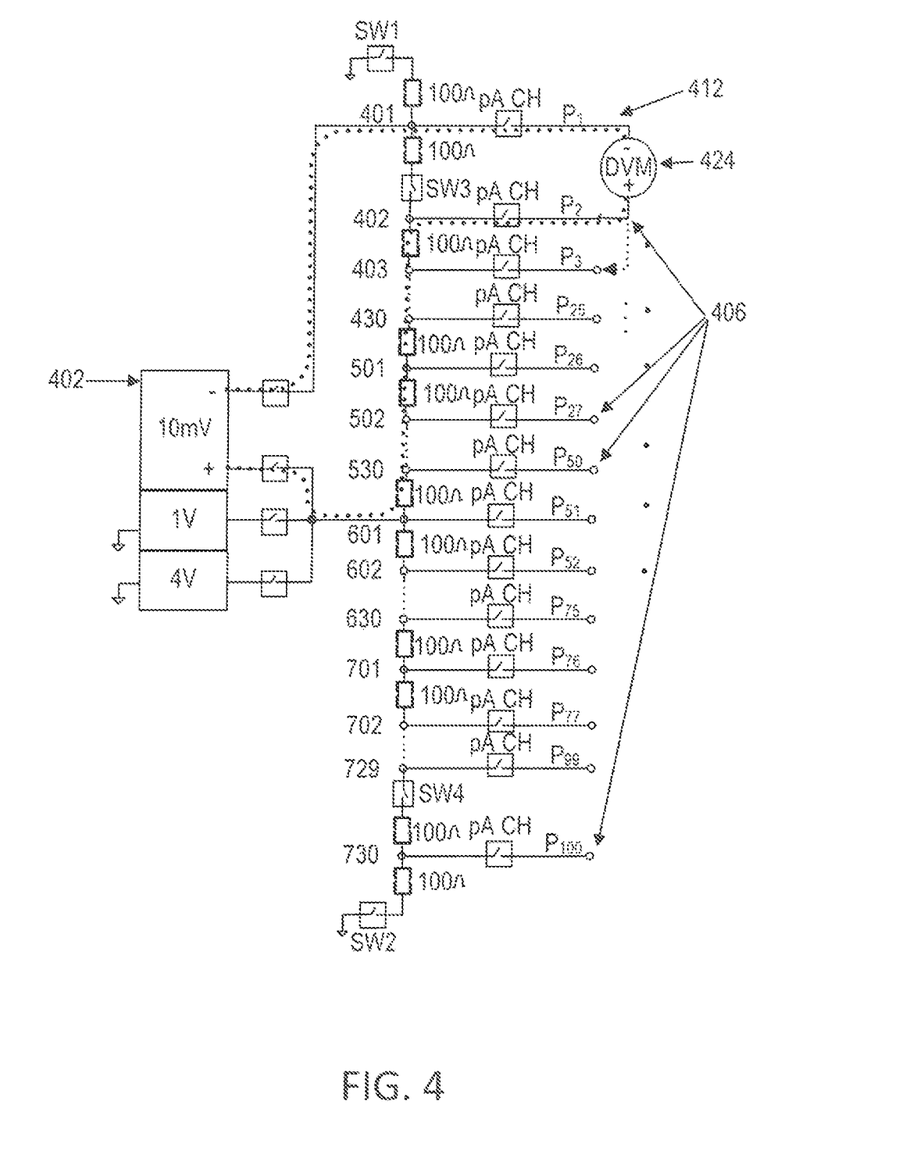
FIG. 4 is an exemplary circuit diagram illustrating the manner in which the signal paths are characterized in a test apparatus where a digital multi-meter is being used to perform differential measurement between channels in accordance with one embodiment of the present invention.

FIG. 4 is an exemplary circuit diagram illustrating the manner in which the signal paths are characterized in a test apparatus where a digital multi-meter is being used to perform differential measurement between channels in accordance with one embodiment of the present invention.

In order to determine the thermal EMF of each channel, DMM 370 is first used to determine a series of differential voltages between a reference channel and all the other channels in the test apparatus. In one embodiment, a reference voltage is used for measuring the differential voltage between the reference and other channels. For example, in the embodiment of FIG. 4, a 10 mV voltage reference is used. The voltage reference, Vref 402 typically needs to be precisely known and is typically floating with respect to the system ground or the ground reference of the circuit under test.

The system may have "n" signal paths, P1 to Pn. The calibration, as indicated above, in one embodiment, starts by measuring the Vref 402 with (n−1) pairs of signal paths: {P1, P2}, {P1, P3}, . . . , {P1, Pn} to obtain {$VM_k$ where k=

1, . . . n−1}. The system in FIG. 4, for example, has 100 channels or signal paths. If channel 1, 412, is used as a reference channel, a differential voltage would first be measured between all the other channels, 406, and channel 1, 412. In the apparatus of FIG. 4, for example, with 100 channels, 99 different measurements would be taken by Digital Voltmeter (DVM) (or DMM) 424. It should be noted that any channel in the system can be used as a reference channel. Each measured pair is multiplexed into the DVM for measurement. In one embodiment, the interface board 312 is configured with multiplexers 358 that allow the measurements between the reference channel and the other channels to be taken easily without needing to physically switch the DVM connections. Meanwhile, multiplexer 359 allows the test apparatus to switch between different measurement instruments, e.g., DMM 370 and LCR meter 371.

The differential voltage measurement for each of the (n−1) pairs as recorded by DVM 424 will have some thermal EMF related error built into it, wherein both channels contribute to the error. Accordingly, embodiments of the present invention must be used so that a respective error can be attributed to each channel separately. In one embodiment, the calibration process of the present invention characterizes all the channel paths and provides correction factors for the differential measurements as will be explained further below.

As discussed above, the DVM 424 is used to measure Vref for all 99 pairs of channels for the test apparatus illustrated in FIG. 4. The voltage measured for a given pair comprises the reference voltage and the difference in offset voltages between the reference channel, e.g. Channel 1 and the channel being measured (Channel M). The vector of measured voltages, $\{VM_k\}$ of all 99 pairs can accordingly be represented by the following equation:

$$\{VM_k\} = \{V_{ofs}(CH_k) + V_{ref} - V_{ofs}(CH_1); \text{ where } k=2 \text{ to } 100\} \quad (1)$$

In the example of FIG. 4, Vref is fixed at 10 mV. $\{VM_k\}$ is the vector of measured voltages for all 99 pairs as stated above. $V_{ofs}(CH_k)$ is the offset voltage for the k-th channel while $V_{ofs}(CH_1)$ is the offset voltage of Channel 1.

It is appreciated that the thermal EMF of each signal path will be random. In other words, each path will typically comprise a random number and combination of connections. Accordingly, the thermal EMF of each signal path can be positive, or negative, small or large. Thus, from a statistical perspective, in accordance with embodiments of the present invention, the average of all the thermal EMFs in the system should either be 0 or approximate to 0. The more the signal paths in a test apparatus, the closer the average thermal EMF of all the paths will be to 0. For the purposes of this illustration, therefore, the average of $V_{ofs}(CH_k)$ will be approximated to 0.

Accordingly, the average of the measured voltage vector can be represented as the following:

$$V_{avg} = \text{Average } \{VM_k \text{ where } k=2 \text{ to } 100\} \cong V_{ref} - V_{ofs}(CH_1) \quad (2)$$

As explained above, the average offset voltage of all the channels, $V_{ofs}(CH_k)$, drops out in equation (2) because it approximates to 0. Thus, the offset voltage (or thermal EMF) of Channel 1 can be determined using equation (2), where:

$$V_{ofs}(CH_1) = V_{ref} - V_{avg} \quad (3)$$

$V_{avg}$ is the simply the measured average of all the (n−1) pairs and $V_{ref}$ will be 10 mV in the example illustrated in FIG. 4. Thus, the offset voltage of Channel 1 can be calculated.

Using the offset voltage of Channel 1, the offset voltage of any other channel can be determined using equation 1. For example, the offset voltage of Channel 3 would be given by the following:

$V_{ofs}(CH_3) = VM_3 - V_{ref} + V_{ofs}(CH_1)$ (4), where $VM_3$ is the measured differential voltage between channel 3 and channel 1. Substituting equation (3) into equation (4) $V_{ofs}(CH_3)$ can also be represented as the following:

$$V_{ofs}(CH_3) = VM_3 - V_{avg} \quad (5)$$

Similarly, the offset voltage of any channel M can be represented by the following:

$$V_{ofs}(CH_M) = VM_M - V_{avg} \quad (6)$$

Once, all the thermal EMFs of the paths are determined, then the calculated thermal EMFs can be used to adjust the measured DC voltage between any two paths, e.g., path j and k, in the system to determine the true voltage, wherein the true voltage is given by the following formula:

$V_t = VM_{jk} + V_{ofs}(CH_j) - V_{ofs}(CH_k)$ (5), where $V_t$ is the true voltage after it has been adjusted for thermal EMF and where $VM_{jk}$ is the measured voltage between paths j and k.

Figure 5:
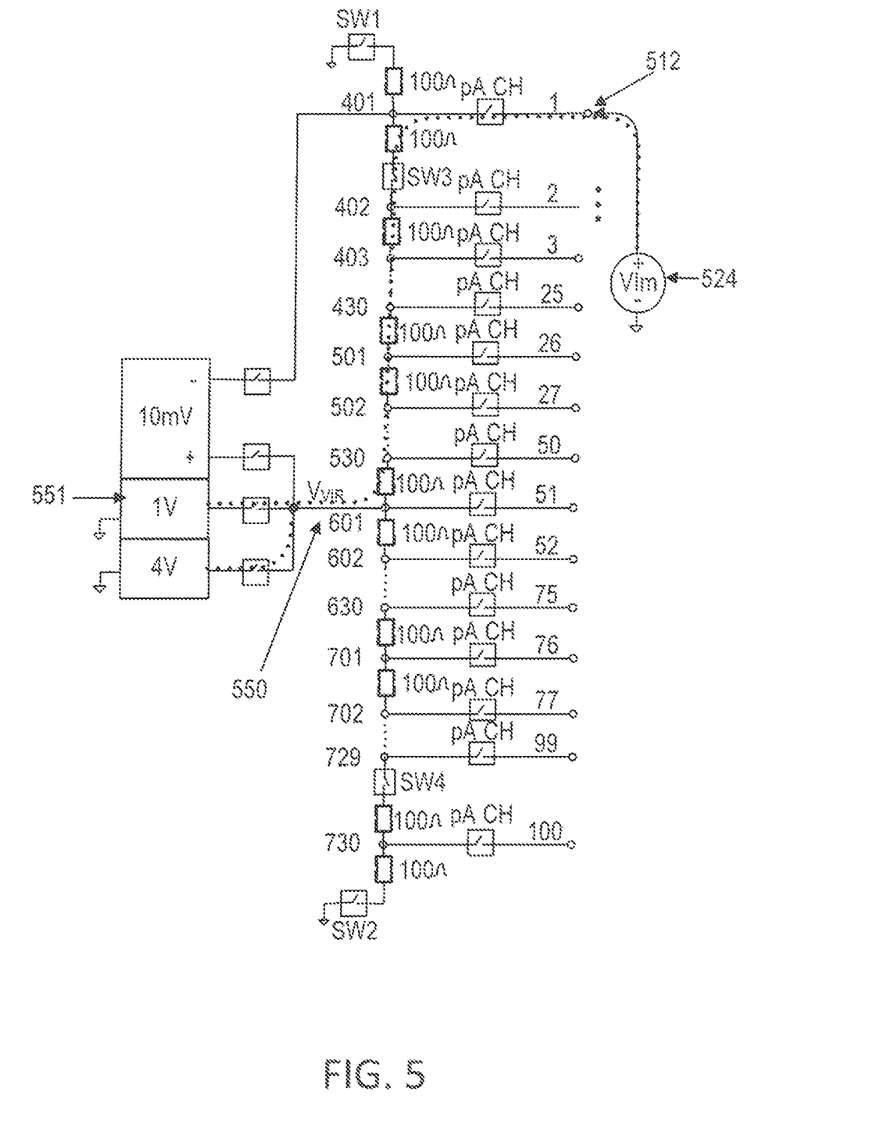
FIG. 5 is an exemplary circuit diagram illustrating the manner in which the offset voltage calculated using the circuit in FIG. 4 is used to perform a high accuracy single ended voltage measurement in accordance with one embodiment of the present invention.

FIG. 5 is an exemplary circuit diagram illustrating the manner in which the offset voltage calculated using the circuit in FIG. 4 is used to perform a high accuracy single ended voltage measurement in accordance with one embodiment of the present invention.

Once the channel offsets are determined for each path using differential channel measurements, the determined values can be used to correct other types of measurements taken by the test apparatus. For example, the derived channel offsets can be used to correct single-ended measurements taken by VI measures within the test apparatus.

As shown in FIG. 3, each channel within test head 306 comprises a VI measure, e.g., VI measure 358 that can be used to take single-ended voltage or current measurements of DUTs connected to any of the channels 308, e.g., P401, P402, etc. Multiplexers 362 can be used to connect the VI measures to each respective channel.

The example illustrated in FIG. 5 shows VI measure 524 measuring a 1V voltage reference (or DUT) through channel 1, 512. It should be noted that the DUT could be at any voltage e.g., 4V, 10 V etc. The measurement, $V_n$, taken by VI measure 524 can be characterized by the following equation:

$$V_n = V_{ofs}(CH_n) + V_{VIR} - V_{GFS} \quad (7)$$

In the above equation, the measured voltage, $V_n$, equals the channel offset $V_{ofs}(CH_n)$, as measured earlier, plus the DUT voltage (or reference voltage) $V_{VIR}$ minus the ground offset error $V_{GFS}$. Ground offset error occurs because the ground reference uses by the VI, e.g., VI 524 in the test apparatus will not be the same as the ground reference used by the DUT or voltage reference it is connected to, e.g. DUT or reference 551. Thus, it is necessary to calibrate for ground offset error.

The ground offset error can be represented as the following:

$V_{GFS} = V_{GNDVIn} - V_{GNDDUT}$ (8), where the ground offset error is the difference between the ground at the VI measure ($V_{GNDVIn}$) and the ground at the DUT ($V_{GNDDUT}$).

The ground offset error can be determined using equation (7). The channel offset can be calculated using the technique illustrated in FIG. 4, $V_{VIR}$ is the DUT or voltage reference voltage 551, and $V_n$ is the voltage measured by the VI measure, e.g. VI measure 524. The value of $V_{GFS}$ so determined can be used to determine the corrected voltage at the DUT or voltage reference, Vn_corrected, wherein Vn_corrected is determined using the following equation:

$$Vn\_corrected = V_n - V_{ofs}(CH_n) + V_{GFS} \quad (9)$$

Figure 6:
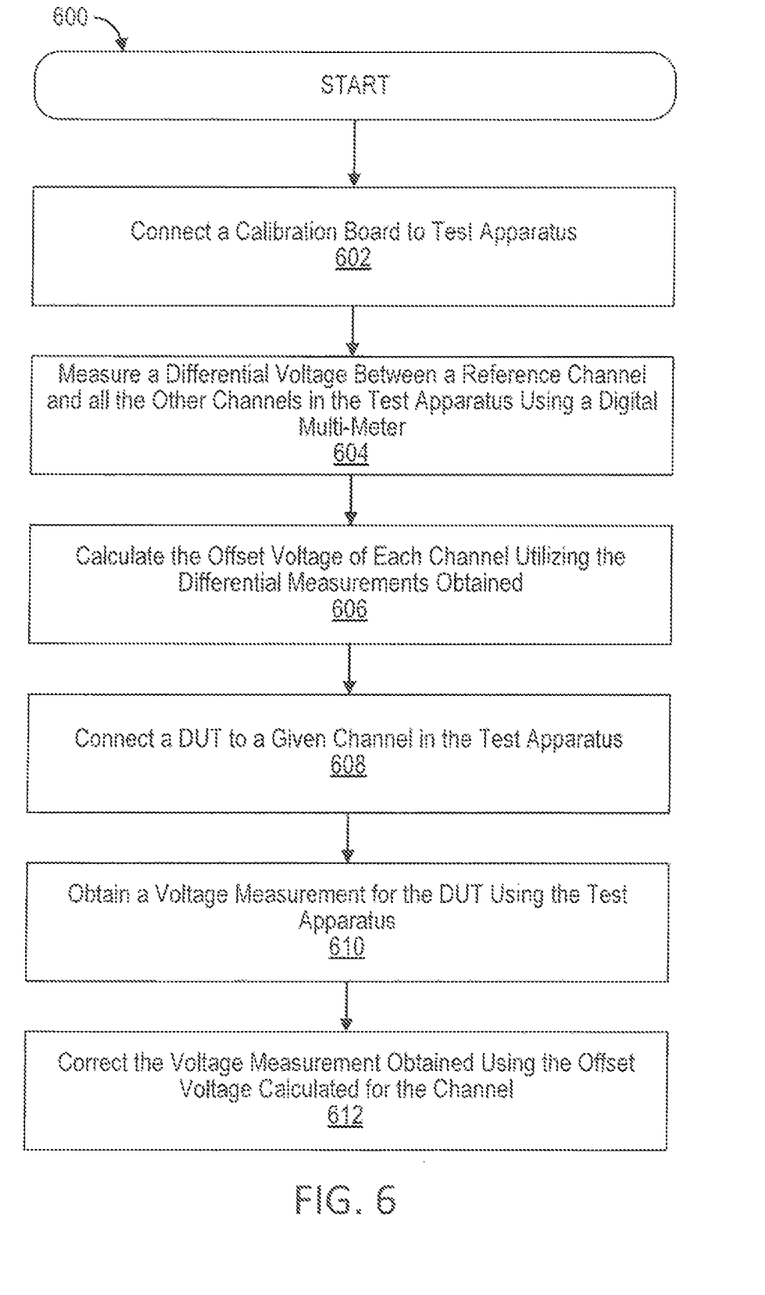
FIG. 6 depicts a flowchart of an exemplary computer controlled process for employing a statistical process to characterize and correct for thermal EMF values for each individual signal path in a test apparatus separately in accordance with one embodiment of the present invention.

FIG. 6 depicts a flowchart of an exemplary computer controlled process for employing a statistical process to characterize and correct for thermal EMF values for each individual signal path in a test apparatus separately in accordance with one embodiment of the present invention. The invention, however, is not limited to the description provided by flowchart 600. Rather, it will be apparent to persons skilled in the relevant art(s) from the teachings provided herein that other functional flows are within the scope and spirit of the present invention. Flowchart 600 will be described with continued reference to exemplary embodiments described above though the method is not limited to those embodiments.

At step 602, a calibration board 302 is connected to the test apparatus in order to calibrate the tester.

As explained above, at step 604, the calibration, in one embodiment, starts by measuring the Vref 402 with (n−1) pairs of signal paths: {P1, P2}, {P1, P3}, . . . , {P1, Pn} to obtain {$VM_k$ where k=1, . . . n−1}. For example, for the system illustrated in FIG. 4, with a 100 channels, if channel 1, 412, is used as a reference channel, a differential voltage would first be measured between all the other channels, 406, and channel 1, 412.

Figure 7:
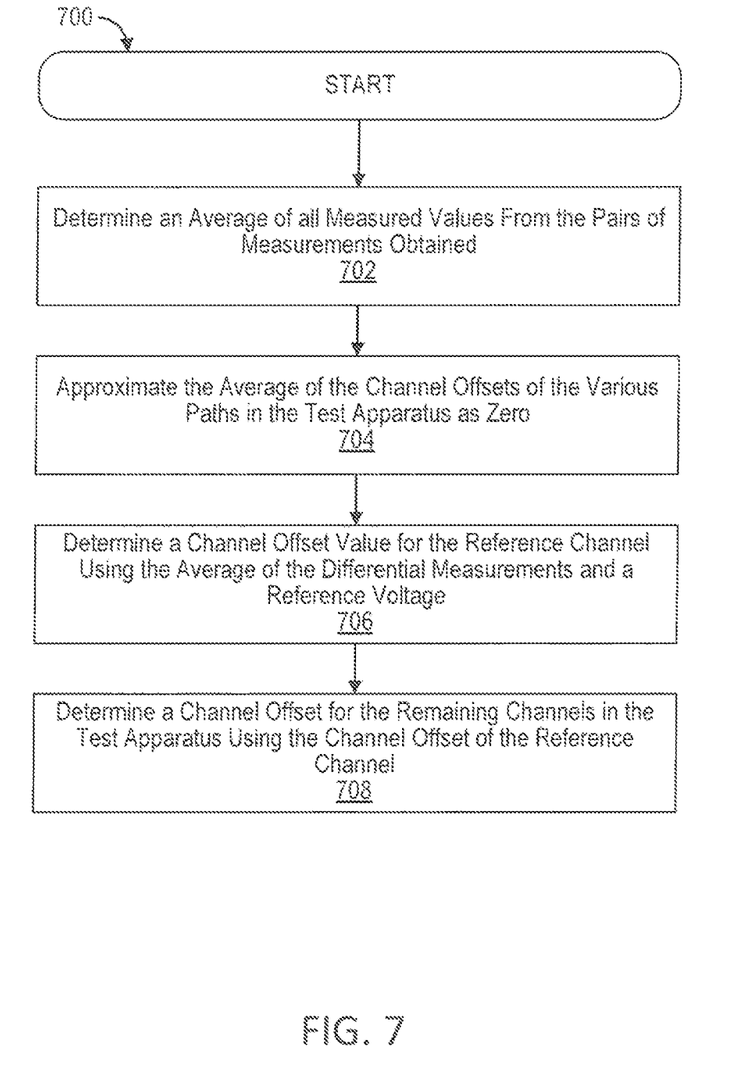
FIG. 7 depicts a flowchart of an exemplary computer controlled process for calculating the offset voltage of each channel in a test apparatus in accordance with one embodiment of the present invention.

At step 606, the offset voltage, $V_{ofs}(CH_n)$, is calculated for each of the signal paths, e.g., P1 to P100 in FIG. 4, using the differential measurements from the prior step. FIG. 7 provides further details on how the offset voltage for each channel is calculated.

At step 608, the calibration board 302 is replaced with a DUT that is connected to the tester apparatus.

At step 610, a voltage measurement is obtained for the DUT using any channel to obtain a single-ended measurement or any pair of channels to obtain a differential measurement.

At step 612, the voltage measurement obtained is offset by the correction factor or offset voltage calculated for each of the channels to obtain a more accurate voltage measurement.

FIG. 7 depicts a flowchart of an exemplary computer controlled process for calculating the offset voltage of each channel in a test apparatus in accordance with one embodiment of the present invention. The invention, however, is not limited to the description provided by flowchart 700. Rather, it will be apparent to persons skilled in the relevant art(s) from the teachings provided herein that other functional flows are within the scope and spirit of the present invention. Flowchart 700 will be described with continued reference to exemplary embodiments described above though the method is not limited to those embodiments.

At step 702, an average of all the differential voltages for all pairs of signal paths: {P1, P2}, {P1, P3}, . . . , {P1, Pn} calculated at step 604 in FIG. 7 is obtained.

At step 704, the average of all the channel offset errors of all the paths in the system are approximated as zero. As explained above, if all paths are drawn randomly, statistically the positive and negative values of offset errors for all the paths would average out to zero and the higher the number of paths in a test system, the closer this approximation is to zero.

At step 706, a channel offset value is determined for the reference channel using the average of all the differential voltages from step 702 and the static reference voltage value.

Finally, at step 708, using the channel offset of the reference channel calculated at step 708, a channel offset for each of the remainder of the channels is calculated.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method of error correction in automated test equipment (ATE), said method comprising:
    calibrating said ATE using a calibration board, wherein said calibration board comprises a reference voltage and wherein said calibrating comprises:
        measuring said reference voltage using a reference channel and each of a plurality of channels in said ATE;

recording a series of differential voltage measurement values obtained from said measuring in a calibration module; and calculating a respective correction factor for each of said plurality of channels utilizing said series of differential voltage measurement values;

measuring a voltage value for a DUT connected to a first channel in said ATE, wherein said first channel is one of said plurality of channels; and correcting said measured voltage value using a respective correction factor for said first channel.

2. The method of claim 1, wherein said respective correction factor is an offset voltage value to correct for thermal EMF related error in an associated channel.

3. The method of claim 1, wherein said series of differential voltage measurement values are obtained using a digital voltmeter.

4. The method of claim 1, wherein said calculating comprises:

determining an average of said series of differential voltage measurement values;

approximating an average of a plurality of correction factors corresponding to thermal EMF related errors in said plurality of channels as zero;

computing a correction factor corresponding to thermal EMF related error for said reference channel using said average and a value of said reference voltage; and computing a series of correction factors for said plurality of channels, one correction factor for each of said plurality of channels, using said correction factor for said reference channel, wherein each of said series of correction factors corresponds to thermal EMF related error in a respective channel.

5. The method of claim 1, wherein said measured voltage value for said DUT is a differential measurement made between said first channel and a second channel in said ATE, wherein said second channel is one of said plurality of channels.

6. The method of claim 1, wherein said measured voltage value for said DUT is a single-ended voltage measurement value.

7. The method of claim 6, wherein said single-ended voltage measurement value is further corrected for ground offset error, wherein said ground offset error results from an uncommon ground between a measurement instrument and said DUT.

8. A non-transitory computer-readable storage medium having stored thereon, computer executable instructions that, if executed by a computer system cause the computer system to perform a method of error correction in automated test equipment (ATE), said method comprising:

calibrating said ATE using a calibration board, wherein said calibration board comprises a reference voltage and wherein said calibrating comprises:

measuring said reference voltage using a reference channel and each of a plurality of channels in said ATE;

recording a series of differential voltage measurement values obtained from said measuring;

calculating a respective correction factor for each of said plurality of channels utilizing said series of differential voltage measurement values; and storing a plurality of correction factors corresponding to said plurality of channels in a memory module;

measuring a voltage value for a DUT connected to a first channel in said ATE, wherein said first channel is one of said plurality of channels; and correcting said measured voltage value using a respective correction factor for said first channel.

9. The computer-readable medium as described in claim 8, wherein said respective correction factor is an offset voltage value to correct for thermal EMF related error in an associated channel.

10. The computer-readable medium as described in claim 8, wherein said calculating further comprises:

determining an average of said series of differential voltage measurement values;

approximating an average of a plurality of correction factors corresponding to thermal EMF related errors in said plurality of channels as zero;

computing a correction factor corresponding to thermal EMF related error for said reference channel using said average and a value of said reference voltage; and computing a series of correction factors for said plurality of channels, one correction factor for each of said plurality of channels, using said correction factor for said reference channel, wherein each of said series of correction factors corresponds to thermal EMF related error in a respective channel.

11. The computer-readable medium as described in claim 8, wherein said measured voltage value for said DUT is a differential measurement made between said first channel and a second channel in said ATE, wherein said second channel is one of said plurality of channels.

12. The computer-readable medium as described in claim 8, wherein said measured voltage value for said DUT is a single-ended voltage measurement value.

13. The computer-readable medium as described in claim 12, wherein said single-ended voltage measurement value is further corrected for ground offset error, wherein said ground offset error results from an uncommon ground between a measurement instrument and said DUT.

14. A system for performing error correction in automated test equipment (ATE), said system comprising:

a memory comprising a test application stored therein;

a test interface to connect to a plurality of DUTs;

a calibration board for calibrating said ATE, wherein said calibration board comprises a reference voltage, and wherein said calibration board is configured to plug into said test interface;

a processor coupled to said memory and said test interface, wherein said processor is configured to:

measure said reference voltage using a reference channel and each of a plurality of channels in said ATE;

record a series of differential voltage measurement values obtained from said measuring in a calibration memory module;

calculate a respective correction factor for each of said plurality of channels utilizing said series of differential voltage measurement values; and store a plurality of correction factors corresponding to said plurality of channels in a memory module; and a voltage measuring device configured to measure a voltage value for a DUT connected to a first channel in said ATE, wherein said first channel is one of said plurality of channels; and wherein said processor is further configured to correct said measured voltage value using a respective correction factor for said first channel.

15. The system of claim 14, wherein said respective correction factor is an offset voltage value to correct for thermal EMF related error in an associated channel.

16. The system of claim 14, wherein to calculate said correction factor for each of said plurality of channels, said process is configured to:
- determine an average of said series of differential voltage measurement values;
- approximate an average of a plurality of correction factors corresponding to thermal EMF related errors in said plurality of channels as zero;
- compute a correction factor corresponding to thermal EMF related error for said reference channel using said average and a value of said reference voltage; and
- compute a series of correction factors for said plurality of channels, one correction for each of said plurality of channels, using said correction factor for said reference channel, wherein each of said series of correction factors corresponds to thermal EMF related error in a respective channel.

17. The system of claim 14, wherein said measured voltage value for said DUT is a differential measurement made between said first channel and a second channel in said ATE, wherein said second channel is one of said plurality of channels.

18. The system of claim 14, wherein said measured voltage value for said DUT is a single-ended voltage measurement value.

* * * * *